(12) United States Patent
Vinson et al.

(10) Patent No.: US 8,144,458 B2
(45) Date of Patent: Mar. 27, 2012

(54) COMPONENT LAYOUT IN AN ENCLOSURE

(75) Inventors: Wade D. Vinson, Magnolia, TX (US);
John P. Franz, Houston, TX (US);
Arthur K. Farnsworth, Cypress, TX (US); David W. Sherrod, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 461 days.

(21) Appl. No.: 12/138,622

(22) Filed: Jun. 13, 2008

(65) Prior Publication Data

US 2009/0016010 A1 Jan. 15, 2009

Related U.S. Application Data

(60) Provisional application No. 60/943,684, filed on Jun. 13, 2007, provisional application No. 60/943,977, filed on Jun. 14, 2007.

(51) Int. Cl.
*H05K 5/00* (2006.01)
*H05K 7/20* (2006.01)
*F28F 7/00* (2006.01)

(52) U.S. Cl. .................. 361/679.46; 361/709; 361/718; 361/719; 361/679.47; 165/80.2; 165/80.3; 454/184

(58) Field of Classification Search ............ 361/679.46, 361/679.47, 709, 718, 719; 165/80.2, 80.3; 454/184
See application file for complete search history.

(56) References Cited

U.S. PATENT DOCUMENTS

| | | | | |
|---|---|---|---|---|
| 4,401,351 A * | 8/1983 | Record | ................. | 439/61 |
| 4,599,680 A * | 7/1986 | Gibson et al. | ............ | 361/679.31 |
| 4,702,154 A * | 10/1987 | Dodson | ................. | 454/184 |
| 4,979,062 A * | 12/1990 | Stefansky et al. | ........ | 360/97.02 |
| 5,051,868 A * | 9/1991 | Leverault et al. | ......... | 361/679.6 |
| 5,091,822 A | 2/1992 | Takashima | | |
| 5,122,914 A * | 6/1992 | Hanson | ................. | 360/98.01 |
| 5,193,050 A * | 3/1993 | Dimmick et al. | ............ | 361/694 |
| 5,218,514 A * | 6/1993 | Huynh et al. | ............ | 361/679.47 |
| 5,227,957 A * | 7/1993 | Deters | ................. | 361/679.32 |
| 5,457,602 A * | 10/1995 | Kimura et al. | ............ | 361/679.33 |
| 5,550,710 A * | 8/1996 | Rahamim et al. | ........ | 361/679.41 |
| 5,596,483 A * | 1/1997 | Wyler | ................. | 361/679.47 |
| 5,644,472 A * | 7/1997 | Klein | ................. | 361/695 |
| 5,652,695 A * | 7/1997 | Schmitt | ................. | 361/679.31 |
| 5,687,059 A * | 11/1997 | Hoppal | ................. | 361/679.31 |
| 5,793,998 A * | 8/1998 | Copeland et al. | ............ | 710/305 |
| 5,813,243 A * | 9/1998 | Johnson et al. | ............ | 62/259.2 |
| 5,822,184 A * | 10/1998 | Rabinovitz | ............ | 361/679.31 |
| 6,052,278 A * | 4/2000 | Tanzer et al. | ............ | 361/679.33 |
| 6,055,152 A * | 4/2000 | Felcman et al. | ......... | 361/679.39 |
| 6,058,016 A * | 5/2000 | Anderson et al. | ............ | 361/727 |
| 6,061,236 A * | 5/2000 | Klein | ................. | 361/695 |
| 6,069,792 A * | 5/2000 | Nelik | ................. | 361/679.47 |
| 6,215,658 B1 | 4/2001 | Bodini | | |
| 6,215,659 B1 * | 4/2001 | Chen | ................. | 361/695 |
| 6,229,699 B1 * | 5/2001 | Kerrigan et al. | ............ | 361/679.6 |
| 6,289,678 B1 * | 9/2001 | Pandolfi | ................. | 62/3.2 |
| 6,313,984 B1 * | 11/2001 | Furay | ................. | 361/679.31 |
| 6,320,744 B1 * | 11/2001 | Sullivan et al. | ......... | 361/679.34 |
| 6,388,873 B1 * | 5/2002 | Brooks et al. | ............ | 361/679.34 |

(Continued)

*Primary Examiner* — Bradley Thomas

(57) ABSTRACT

An electronic module includes an enclosure having a front face and a rear face. An electronic circuit board is positioned in the enclosure and a processor is mounted to the electronic circuit board. A data storage device is positioned in the enclosure such that the processor is positioned between the data storage device and the electronic circuit board.

18 Claims, 2 Drawing Sheets

U.S. PATENT DOCUMENTS

| | | | |
|---|---|---|---|
| 6,407,910 B1* | 6/2002 | Diaz et al. | 361/679.37 |
| 6,411,522 B1* | 6/2002 | Frank et al. | 361/800 |
| 6,452,790 B1* | 9/2002 | Chu et al. | 361/679.52 |
| 6,459,577 B1* | 10/2002 | Holmes et al. | 361/690 |
| 6,480,380 B1* | 11/2002 | French et al. | 361/690 |
| 6,483,699 B1* | 11/2002 | Salmonson et al. | 361/679.51 |
| 6,490,153 B1 | 12/2002 | Casebolt et al. | |
| 6,490,157 B2* | 12/2002 | Unrein | 361/679.46 |
| 6,565,444 B2 | 5/2003 | Nagata et al. | 463/46 |
| 6,567,271 B2* | 5/2003 | Stone et al. | 361/724 |
| 6,574,100 B1* | 6/2003 | Anderson | 361/679.5 |
| 6,593,673 B1* | 7/2003 | Sugai et al. | 307/116 |
| 6,618,246 B2* | 9/2003 | Sullivan et al. | 361/679.46 |
| 6,621,693 B1* | 9/2003 | Potter et al. | 361/679.33 |
| 6,771,499 B2 | 8/2004 | Crippen et al. | |
| 6,785,133 B2 | 8/2004 | Barringer et al. | |
| 6,934,150 B2* | 8/2005 | Kitchen et al. | 361/679.33 |
| 6,965,516 B1* | 11/2005 | Lin | 361/727 |
| 6,967,837 B2* | 11/2005 | Shih | 361/679.48 |
| 6,999,312 B1* | 2/2006 | Garnett et al. | 361/679.54 |
| 7,203,949 B2* | 4/2007 | Shih | 720/654 |
| 7,254,035 B2* | 8/2007 | Sasaki et al. | 361/721 |
| 7,304,841 B2* | 12/2007 | Lee et al. | 361/679.48 |
| 7,307,834 B2* | 12/2007 | Jones et al. | 361/679.55 |
| 7,361,081 B2* | 4/2008 | Beitelmal et al. | 454/184 |
| 7,403,385 B2* | 7/2008 | Boone et al. | 361/692 |
| 7,623,343 B2* | 11/2009 | Chen | 361/679.32 |
| 7,652,878 B2* | 1/2010 | Tsai | 361/679.33 |
| 7,703,291 B2* | 4/2010 | Bushnik et al. | 62/3.2 |
| 7,719,837 B2* | 5/2010 | Wu et al. | 361/699 |
| 7,826,212 B2* | 11/2010 | Shogan et al. | 361/679.46 |
| 2002/0051338 A1* | 5/2002 | Jiang et al. | 361/685 |
| 2002/0067595 A1 | 6/2002 | Ogawa | 361/687 |
| 2004/0052046 A1 | 3/2004 | Regimbal et al. | 361/687 |
| 2004/0057203 A1* | 3/2004 | Rabinovitz | 361/685 |
| 2004/0062002 A1* | 4/2004 | Barringer et al. | 361/687 |
| 2004/0070949 A1* | 4/2004 | Oikawa et al. | 361/718 |
| 2004/0095723 A1 | 5/2004 | Tsai et al. | 361/695 |
| 2004/0145869 A1* | 7/2004 | Tanaka et al. | 361/695 |
| 2004/0221604 A1 | 11/2004 | Ota et al. | |
| 2005/0047083 A1 | 3/2005 | Kondo et al. | |
| 2005/0174737 A1* | 8/2005 | Meir | 361/697 |
| 2005/0225936 A1 | 10/2005 | Day | |
| 2005/0259395 A1* | 11/2005 | Espinoza-Ibarra et al. | 361/695 |
| 2006/0067046 A1 | 3/2006 | Dey et al. | |
| 2007/0081315 A1* | 4/2007 | Mondor et al. | 361/788 |
| 2007/0091559 A1 | 4/2007 | Malone | |
| 2007/0097624 A1* | 5/2007 | Ip et al. | 361/687 |
| 2007/0171607 A1* | 7/2007 | Tanaka | 361/687 |
| 2007/0230111 A1* | 10/2007 | Starr et al. | 361/685 |
| 2008/0106866 A1* | 5/2008 | Hori et al. | 361/695 |
| 2008/0180896 A1* | 7/2008 | McClure et al. | 361/683 |

* cited by examiner

COMPONENT LAYOUT IN AN ENCLOSURE

CROSS-REFERENCE TO RELATED APPLICATIONS

This Utility Patent Application is based on and claims the benefit of U.S. Provisional Application No. 60/943,684, filed on Jun. 13, 2007, and U.S. Provisional Application No. 60/943,977, filed on Jun. 14, 2007, the contents of which are both hereby incorporated by reference in their entirety.

BACKGROUND

Servers include several components to accomplish various tasks such as data storage, data processing, routing, etc., and can be designed to include a high amount of computing power to accomplish these tasks. During performance of these tasks, electrical current is generated that creates heat. Cooling systems can be provided to provide airflow over electrical components within the server to prevent overheating and/or failure of components.

DETAILED DESCRIPTION

In the following detailed description, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
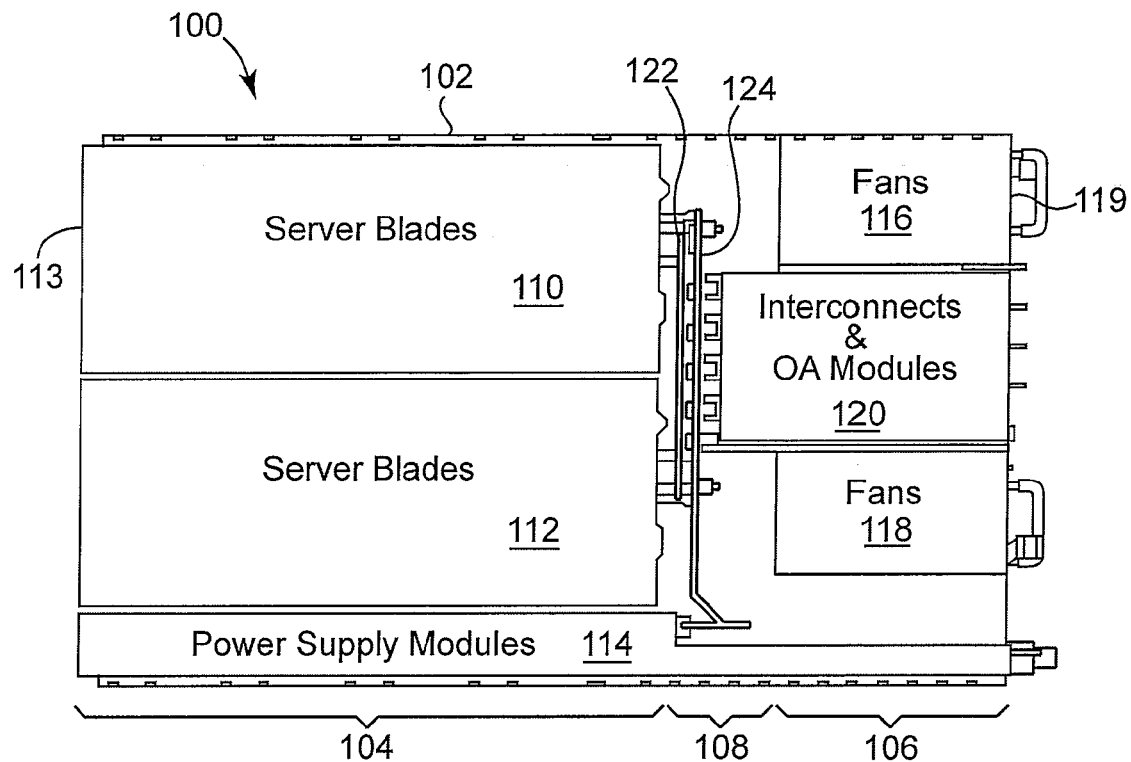
FIG. 1 is a side view of one embodiment of a server enclosure.

FIG. 1 is a schematic view of one embodiment of a server enclosure 100. Sever enclosure 100 includes a chassis 102 that is arranged in a front region 104, a back region 106 and a central plenum 108 positioned between the front region 104 and the back region 106. In one embodiment, as described below, chassis 102 includes a plurality of sections for housing components therein. It is worth noting that any number of electronic modules, air movers and other components can be positioned with chassis 102 as desired.

In the illustrated embodiment, front region 104 includes a module or server region having a plurality of upper bays 110 and lower bays 112 for housing electronic modules (e.g., server blades, storage blades, optical drives) and at least one airflow inlet, one of which is schematically illustrated as inlet 113, to allow air to flow into a front of the chassis 102. In one embodiment, front region 104 also houses one or more power supply modules in section 114.

In one embodiment, back region 106 is adapted to house a plurality of air movers in sections 116 and 118 as well as other modules (e.g., keyboard video mouse modules, interconnect modules, on-board administration modules) in section 120. In one embodiment, a signal midplane module 122 and a backplane power module 124 are provided in back region 106. Signal midplane module 122 transmits signals between servers in bays 110 and 112 to modules in section 120. Backplane power module 124 is provided to distribute power from the power supply modules in section 114 to electrical components stored within chassis 102.

In one embodiment, air movers in sections 116 and 118 are in fluid communication with central plenum 108 and operate to bring air into chassis 102 through front region 104 and out at least one air flow outlet, one of which is schematically illustrated at outlet 119, in a rear of chassis 102. Operation of the air movers thus creates a negative pressure region within central plenum 108.

Figure 2:
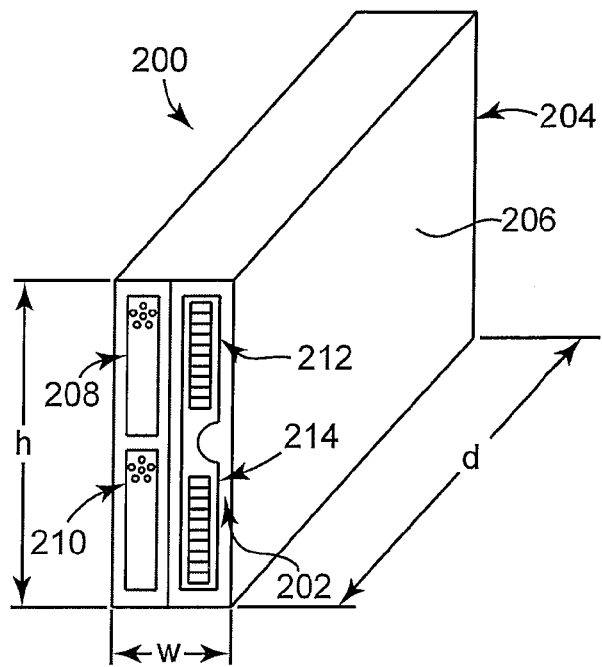
FIG. 2 is an isometric view of one embodiment of a blade enclosure.

FIG. 2 is an isometric view of a blade enclosure 200 that can be positioned in one of the bays of server enclosure 100, for example, in one of upper bays 110 or one of lower bays 112. In one embodiment, blade enclosure 200 is a generally rectangular enclosure defined by a height 'h', a width 'w' and a depth 'd' and includes a front face 202, a rear face 204, and an outer body 206 positioned between the front face 202 and the rear face 204. During operation, air flows into blade enclosure 200 through front face 202 and exits enclosure 200 through rear face 204.

In one embodiment, front face 202 includes first and second airflow inlets 208 and 210 on one side of front face 202 that lead to corresponding data storage devices positioned within blade enclosure 200. In one embodiment, the data storage devices can be "hot pluggable", meaning they can be inserted and/or removed from enclosure 200 while enclosure 200 is operational. In one embodiment, third and forth airflow inlets 212 and 214 are positioned on another side of front face 202 that lead to corresponding processers positioned within blade enclosure 200.

Figure 3:
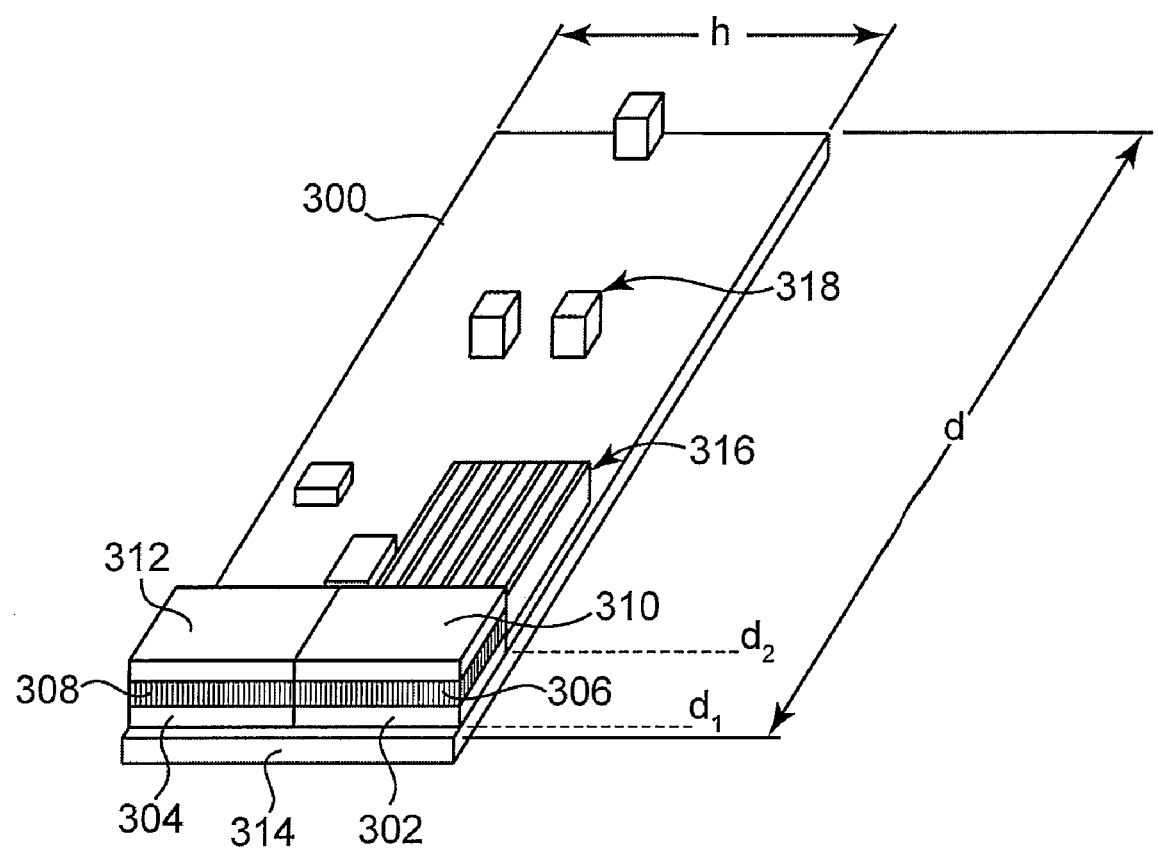
FIG. 3 is an isometric view of one embodiment of an electronic circuit board.

FIG. 3 is an isometric view of one embodiment of an electronic circuit board 300 positioned within enclosure 200. A layout for components on electronic circuit board 300 can be arranged so as to manage airflow within enclosure 200. Mounted on electronic circuit board 300 are processors 302 and 304. In one embodiment, processors 302 and 304 are positioned to receive airflow from airflow inlets 212 and 214.

In one embodiment, processor 302 includes a heat sink 306 mounted thereon and processor 304 includes a heat sink 308 mounted thereon. Heat sink 306 and 308 operate to dissipate heat from processors 302 and 304. In one embodiment, heat sinks 306 and 308 are designed to consume a small volume within enclosure 200.

Mounted above heat sinks 306 and 308 are data storage devices 310 and 312. In one embodiment, data storage devices 310 and 312 comprise hard disk drives for storing data utilized by processors 302 and 304. In one embodiment, data storage devices 310 and 312 receive airflow from airflow inlets 208 and 210.

In one embodiment, as illustrated in FIG. 3, processors 302 and 304 are in parallel with data storage devices 310 and 312. Stated another way, processors 302 and 304 as well as data storage devices 310 and 312 directly receive airflow from a front edge 314 of electronic circuit board 300 at substantially the same distance from front edge 314. In one embodiment, a front side of processors 302 and 304 as well as a front side of data storage devices 310 and 312 are positioned at a distance d1 from front edge 314 and a back side of processors 302 and 304 and data storage devices 310 and 312 are positioned at a distance d2 from front edge 314. By locating processors 302 and 304 and data storage devices 310 and 312 in parallel, processors 302 and 304 can receive airflow in a front region of enclosure 200, which can lead to lower power requirements for fan(s) that cool enclosure 200. Additionally, data storage devices 310 and 312 can be located near front face 202 for easy access such that data storage devices 310 and 312 can be easily installed, removed and/or replaced from enclosure 200.

In the embodiment illustrated, a width of processors 302 and 304 and data storage devices 310 and 312 extends substantially along the entire height 'h' of electronic circuit board 300. By locating components substantially along the entire height of electronic circuit board 300, density of components mounted on electronic circuit board 300 can be increased. Additionally, airflow that enters front face 202 (FIG. 2) can be directed to components housed within enclosure 200 without bypass of the components such that airflow is directed efficiently throughout enclosure 200.

In one embodiment, electronic circuit board 300 also includes a plurality of memory units 316 and a plurality of mezzanine units 318. In one embodiment, memory units 316 and mezzanine units 318 are located behind processors 302 and 304 as well as data storage devices 310 and 312 to receive airflow therefrom. In this manner, memory units 316 and mezzanine units 318 are serially located in an airflow path for enclosure 200 with respect to processors 302 and 304, and data storage devices 310 and 312. In another embodiment, memory units 316 and/or mezzanine units 318 can be located parallel with each other and/or with processors 302 and 304 and data storage devices 310 and 312.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. An electronic module fluidly coupled to a fan to provide airflow thereto, comprising:
    an enclosure including a front face and a rear face such that airflow enters through the front face and exits through the rear face;
    an electronic circuit board positioned in the enclosure;
    a first processor and a second processor mounted to the electronic circuit board, each processor including a front side that receives airflow at a distance from the front face; and
    a first data storage device and a second data storage device positioned in the enclosure, each data storage device including a front side that receives airflow at the distance from the front face such that the first processor is positioned between the first data storage device and the electronic circuit board and the second processor is positioned between the second data storage device and the electronic circuit board, wherein the first processor and the second processor are positioned such that bypass of airflow between the first processor and the second processor is prevented.

2. The electronic module of claim 1 and further comprising a heat sink mounted to the first processor such that the first processor and heat sink are positioned between the first data storage device and the electronic circuit board.

3. The electronic module of claim 1 wherein the front face of the enclosure includes a first airflow inlet communicated with the first processor and a second air flow inlet communicated with the first data storage device.

4. The electronic module of claim 1 and further comprising a memory component mounted to the electronic circuit board, the memory component positioned to receive airflow from the front face and at a greater distance from the front face than the first processor.

5. The electronic module of claim 1 and further comprising a mezzanine component mounted to the electronic circuit board, the mezzanine component positioned to receive airflow from the front face and at a greater distance from the front face than the first processor.

6. The electronic module of claim 1, wherein each processor includes a heat sink coupled thereto.

7. The electronic module of claim 6, wherein each heat sink is positioned between a corresponding data storage device and a corresponding processor.

8. The electronic module of claim 7 wherein the first processor and the second processor and the first data storage device and the second data storage device extend substantially along an entire height of the enclosure.

9. The electronic module of claim 1 wherein a back side of the first processor opposite the front side of the first processor and a back side of the first data storage device opposite the front side of the first data storage device are positioned at a substantially equal distance from the front face of the enclosure along a length of the enclosure.

10. An electronic module, comprising:
    an enclosure having a height, a width, and a depth, the depth being measured from a front face of the enclosure to a rear face of the enclosure, the front face including a plurality of airflow inlets;
    a first processor and a second processor mounted to an electronic circuit board within the enclosure, each processor including a front side positioned to receive airflow from the front face at a distance from the front face along the depth of the enclosure; and
    a first heat sink and a second heat sink mounted to the first processor and the second processor, respectively, each heat sink including a front side positioned within the enclosure to receive airflow from the front face of the enclosure at the distance from the front face along the depth of the enclosure, wherein the first processor and the second processor are positioned such that bypass of airflow between the first processor and the second processor is prevented.

11. The electronic module of claim 10 and further comprising a first data storage device positioned such that the first processor and the first heat sink are positioned between the first data storage device and the electronic circuit board.

12. The electronic module of claim 11 wherein the front face includes a first airflow inlet communicated with the first processor and a second airflow inlet communicated with the first data storage device.

13. The electronic module of claim 10 and further comprising a memory component mounted to the electronic circuit board, the memory component positioned to receive airflow from the front face at a distance greater than the front side of the first processor.

14. The electronic module of claim 10 and further comprising a mezzanine component mounted to the electronic circuit board, the mezzanine component positioned to receive airflow from the front face at a distance greater than the front side of the first processor.

15. The electronic module of claim 10 and further comprising a first data storage device and a second data storage device positioned in the enclosure such that each heat sink is positioned between a corresponding data storage device and a corresponding processor.

16. A method of providing cooling in an electronic module, comprising:
    providing an enclosure having a front face and a rear face, the front face including a first plurality of airflow inlets and a second plurality of airflow inlets;
    positioning an electronic circuit board within the enclosure;
    positioning a first processor having a front side and a second processor having a front side on the electronic circuit board such that the front side of the first processor and the front side of the second processor receive airflow from the first plurality of airflow inlets, wherein the first processor and the second processor are positioned such that bypass of airflow between the first processor and the second processor is prevented; and
    positioning a first data storage device having a front side and a second data storage device having a front side in the enclosure such that the front side of the first data storage device and the front side of the second data storage device receive airflow from the second plurality of airflow inlets, the front side of the first data storage device and the front side of the second data storage device being positioned in parallel with the front side of the first processor and the front side of the second processor, wherein the first data storage device and the second data storage device are positioned such that bypass of airflow between the first data storage device and the second data storage device is prevented.

17. The method of claim 16 and further comprising:
    positioning a first heat sink between the first processor and the first data storage device, the first heat sink adapted to dissipate heat from the first processor; and
    positioning a second heat sink between the second processor and the second data storage device, the second heat sink adapted to dissipate heat from the second processor, wherein the first heat sink and the second heat sink are positioned such that bypass of airflow between the first heat sink and the second heat sink is prevented.

18. The method of claim 16 and further comprising:
    positioning a memory component to receive airflow from the front face at a distance greater than the first processor and the second processor; and
    positioning a mezzanine component to receive airflow from the front face at a distance greater than the memory component.

* * * * *